(12) United States Patent
Buehler et al.

(10) Patent No.: US 11,758,827 B2
(45) Date of Patent: Sep. 12, 2023

(54) MONOFILAMENT FOR PRODUCING AN $Nb_3Sn$-CONTAINING SUPERCONDUCTOR WIRE, ESPECIALLY FOR INTERNAL OXIDATION

(71) Applicant: Bruker EAS GmbH, Hanau (DE)

(72) Inventors: Carl Buehler, Langenselbold (DE); Vital Abaecherli, Erlensee (DE); Bernd Sailer, Alzenau (DE); Klaus Schlenga, Karlsruhe (DE); Manfred Thoener, Biebergemuend (DE); Matheus Wanior, Gelnhausen (DE)

(73) Assignee: BRUKER EAS GMBH, Hanau (DE)

( * ) Notice: Subject to any disclaimer, the term of this patent is extended or adjusted under 35 U.S.C. 154(b) by 780 days.

(21) Appl. No.: 16/664,123

(22) Filed: Oct. 25, 2019

(65) Prior Publication Data
US 2020/0136009 A1     Apr. 30, 2020

(30) Foreign Application Priority Data
Oct. 26, 2018   (DE) .................... 10 2018 126 760.6

(51) Int. Cl.
*H10N 60/01*      (2023.01)
*B22F 5/12*       (2006.01)
(Continued)

(52) U.S. Cl.
CPC .......... *H10N 60/0128* (2023.02); *B22F 5/12* (2013.01); *B22F 7/04* (2013.01); *H01B 12/06* (2013.01);
(Continued)

(58) Field of Classification Search
CPC ........................ H01L 39/2406; H01L 39/2409
See application file for complete search history.

(56) References Cited

U.S. PATENT DOCUMENTS 6,953,770 B2   10/2005   Zhao et al.
7,585,377 B2    9/2009   Field et al.
(Continued)

FOREIGN PATENT DOCUMENTS

CN    1486514 A       3/2004
CN    105913967 A     8/2016
(Continued)

OTHER PUBLICATIONS

Xu et al., "Refinement of Nb3Sn grain size by the generation of ZrO2 precipitates in Nb3Sn wires", Applied Physics Letters, 104, (2014), 5 pages.
(Continued)

*Primary Examiner* — Matthew L Reames
(74) *Attorney, Agent, or Firm* — Edell, Shapiro & Finnan, LLC

(57) ABSTRACT

A monofilament (100) for producing an $Nb_3Sn$-containing superconductor wire (33) includes a powder core (1) with an Sn-containing powder, a reaction tube (3) composed of an Nb alloy that includes Nb and at least one further alloy component X. The powder core is disposed within the reaction tube. The monofilament also includes at least one source (4) for at least one partner component Pk. A respective source includes one or more source structures at a unitary radial position in the monofilament. The alloy component X and the partner component Pk form precipitates XPk on reaction annealing of the monofilament in which Sn from the powder core and Nb from the reaction tube react to produce $Nb_3Sn$. The powder core is disposed in a moderation tube, which in turn is disposed within the reaction tube. This provides a monofilament for a powder-in-tube based $Nb_3Sn$-containing superconductor wire with improved current carrying capacity.

28 Claims, 12 Drawing Sheets

(51) Int. Cl.
  *B22F 7/04* (2006.01)
  *H01B 12/06* (2006.01)
  *H10N 60/85* (2023.01)
(52) U.S. Cl.
  CPC ......... *H10N 60/0156* (2023.02); *H10N 60/85* (2023.02)

(56) References Cited

U.S. PATENT DOCUMENTS

| | | |
|---|---|---|
| 7,791,343 B2 | 9/2010 | Kim |
| 9,741,471 B2 | 8/2017 | Thoener et al. |
| 9,916,919 B2 | 3/2018 | Xu et al. |
| 10,679,775 B2 | 6/2020 | Aimone et al. |
| 2002/0020051 A1 | 2/2002 | Wong |
| 2009/0011941 A1 | 1/2009 | Zaitsu et al. |
| 2016/0351781 A1 | 12/2016 | Seeber |
| 2017/0072470 A1 | 3/2017 | Thoener |

FOREIGN PATENT DOCUMENTS

| | | |
|---|---|---|
| EP | 0169596 B1 | 1/1986 |
| EP | 1993107 A1 | 11/2008 |
| EP | 2779258 B1 | 9/2015 |
| JP | H04138627 A | 5/1992 |
| JP | 2007242355 A | 9/2007 |
| JP | 2010535414 A | 11/2010 |
| JP | 2017513176 A | 5/2017 |
| KR | 20030022336 A | 3/2003 |
| KR | 20180021390 A | 3/2018 |
| WO | 2015175064 A2 | 11/2015 |

OTHER PUBLICATIONS

Motowidlo et al., "An intermetallic powder-in-tube approach to increased flux-pinning in nb3Sn by internal oxidation of Zr", Supercond. Sci Technol 31, 014002, 2018, 12 pages.

X. Xu et al., "Internally Oxidized Nb3Sn Strands with Fine Grain Size and High Critical Current Density", Adv. Mater. 2015, 27, Seiten 1346-1350.

X. Xu, "Prospects for Improving the Critical Current Density of Superconducting Nb3Sn Strands via Optimization of Nb3Sn Fraction, Stoichiometry, and Grain Size", (2016) 177 pages.

X. Xu et al., Recent Progress in Application of Internal Oxidation Technique in Nb3Sn Strands, FERMILAB-CONF-16-342-TD (2016), 5 pages.

Godeke, "Performance Boundaries in Nb3Sn Superconductors", Chapter 2, 2005, pp. 40-42.

Bruce A. Zeitlin et al. "Results on Mono Element Internal Tin $Nb_3Sn$ Conductors (MEIT) With Nb7.5Ta and Nb(1Zr+Ox) Filaments" IEEE Transactions on applied superconductivity, vol. 15, No. 2, Jun. 2005, p. 3393-3398.

MONOFILAMENT FOR PRODUCING AN $Nb_3Sn$-CONTAINING SUPERCONDUCTOR WIRE, ESPECIALLY FOR INTERNAL OXIDATION

CROSS REFERENCE TO RELATED APPLICATIONS

The following disclosure is based on and claims the benefit of and priority under 35 U.S.C. § 119(a) to German Patent Application No. 10 2018 126 760.6, filed Oct. 26, 2018, and the disclosure of which is incorporated in its entirety into the present application by reference.

FIELD OF THE INVENTION

The invention relates to a monofilament for producing an $Nb_3Sn$-containing superconductor wire,
where the monofilament comprises:
  a powder core comprising an Sn-containing powder,
  a reaction tube composed of an Nb alloy comprising Nb and at least one further alloy component X,
where the powder core is disposed within the reaction tube,
where the monofilament further comprises at least one source Q for at least one partner component Pk,
where a respective source Q comprises one or more source structures at a unitary radial position in the monofilament;
where the alloy component X and the partner component Pk are selected such that they are able to form precipitates XPk on a reaction annealing of the monofilament in which Sn from the powder core and Nb from the reaction tube react to give $Nb_3Sn$.

BACKGROUND

A monofilament of this kind has been disclosed by WO 2015/175064 A2.

Superconductor materials are able to carry an electrical current without losses, allowing them to be utilized in various technical applications, such as for generating strong magnetic fields with superconducting coils for example. One superconducting material frequently employed in technical applications is $Nb_3Sn$. To produce superconducting, $Nb_3Sn$-containing wires, precursor wires are typically fabricated that comprise Nb and Sn and that are brought into a desired form for the technical application, and then subjected to reaction annealing. This produces the superconducting $Nb_3Sn$ phase. The precursor wires are differentiated into various types, especially the so-called tube-type precursor wires, powder-in-tube precursor wires, or else rod restack process precursor wires—for the latter, see, for example, U.S. Pat. No. 7,585,377 B2. The production methods and the processes for reaction annealing proceed in some cases very differently for the various types of precursor wires.

The superconducting current-carrying capacity of $Nb_3Sn$-containing wires is dependent especially on the microstructure of the $Nb_3Sn$ phase. A low average grain size, and thus a relatively fine microstructure, improves the superconducting current-carrying capacity. A variety of measures have been disclosed for achieving a relatively fine microstructure, such as, for example, a low temperature during reaction annealing, supported by addition of defined elements such as copper, whereby it is possible to lower the temperature at which the $Nb_3Sn$ phase is formed.

Another measure for obtaining a relatively fine microstructure on the part of the $Nb_3Sn$ phase is that of internal oxidation. In the case of internal oxidation, oxidic precipitates are generated during the heat treatment. These precipitates serve as nucleation seeds in the phase formation of the $Nb_3Sn$, resulting in a relatively fine $Nb_3Sn$ microstructure. The precipitates may additionally inhibit grain growth of the $Nb_3Sn$ phase during the heat treatment. The resultant smaller grain size makes it possible to obtain improved current-carrying capacity on the part of a corresponding superconductor wire—compare, for example, A. Godeke, Ph.D. thesis "Performance Boundaries in $Nb_3Sn$ Superconductors", University of Twente, Enschede, NL (2005), chapter 2.7.

Precipitates may also act as artificial pinning centers (APCs), which likewise improve the current-carrying capacity—cf. L. R. Motowidlo et al., Supercond. Sci. Technol. 31, 014002.

Internal oxidation is also described, for example, in WO 2015/175064 A2, or in X. Xu et al., Adv. Mater. 2015, 27, pages 1346-1350, or in X. Xu et al., Appl. Phys. Lett. 104, 082602 (2014), or in X. Xu, Dissertation "Prospects for Improving the Critical Current Density of Superconducting $Nb_3Sn$ Strands via Optimization of $Nb_3Sn$ Fraction, Stochiometry, and Grain Size", The Ohio State University 2016, chapter 5, or in X. XU et al. FERMILAB-CONF-16-342-TD (2016).

Described for example in EP 2 779 258 B1 is the typical structure of a conventional monofilament for a powder-in-tube precursor wire. A monofilament of this kind comprises a thin-walled internal tube, usually of copper, in which a Sn-containing powder (powder core) is disposed. This internal tube is disposed in turn in a thick-walled external tube, usually of niobium (reaction tube). During the reaction annealing, Sn diffuses from the powder core to the reaction tube, where it forms the $Nb_3Sn$ phase.

WO 2015/175064 A2 proposes a monofilament for a powder-in-tube precursor wire for internal oxidation, wherein a mixture composed of an Sn-containing powder and a metal oxide powder is disposed directly in a tube composed of a NbZr alloy. During reaction annealing, oxygen from the metal oxide powder enters the tube made of the NbZr alloy and forms $ZrO_2$ precipitates. With this precursor wire it is said to be possible to achieve grain refinement to 5-30 nm average grain size, for example, for the $Nb_3Sn$ formed.

In X. Xu et al., Adv. Mater. 2015, 27, pages 1346-1350, in relation to a conductor proposed for internal oxidation by Zeitlin et al. and comprising a multiplicity of annularly disposed NbZr filaments in an internal and external copper matrix, and with a powder core comprising Sn and $SnO_2$ which did not exhibit grain refinement, it is mooted that a copper layer between the powder core and the $ZrO_2$ filaments may have blocked the transport of oxygen—see page 2, right-hand column, last paragraph. The same supposition is expressed in the last sentence on page 121 of the Xu dissertation cited earlier on above.

SUMMARY

It is an object of the present invention to propose a monofilament for a powder-in-tube based $Nb_3Sn$-containing superconductor wire, with which a further improvement can be achieved in current-carrying capacity.

This object is achieved in accordance with one formulation of the invention, by a monofilament of the type specified at the outset, wherein,
the powder core is disposed in a moderation tube,
and wherein the moderation tube is disposed within the reaction tube.

The monofilament of the invention is configured to generate precipitates XPk in the microstructure of the $Nb_3Sn$ phase in a reaction annealing, which takes place typically in a temperature range between 400° C. and 800° C. The alloy component X is provided by way of the reaction tube, and the (at least one) partner component Pk is provided by way of (at least one) source installed in the monofilament. As part of the heat treatment of the reaction annealing, the partner component Pk diffuses to the reaction tube, where it forms the precipitates XPk.

The precipitates in the microstructure of the $Nb_3Sn$ phase are able to contribute in two ways to improved current-carrying capacity: precipitates which are formed before the $Nb_3Sn$ phase comes about generate nucleation centers and inhibit grain growth and hence provide for a finer microstructure. Since grain boundaries act as pinning centers, the refinement of the microstructure raises the current-carrying capacity. Precipitates which are formed after the $Nb_3Sn$ phase has arisen are able to serve as artificial pinning centers (APCs), which may likewise raise the current-carrying capacity.

With the moderation tube it is possible to control the diffusion of Sn from the powder core to the reaction tube. If the powder core simultaneously constitutes a source for the (at least one) partner component Pk, the diffusion of the partner component Pk to the reaction tube can also be influenced by way of the moderation tube; in particular, the concentration of partner component Pk (oxygen, for instance) in front of/at the reaction front during the formation of the various intermetallic Nb—Sn phases can be adjusted during the heat treatment.

As a result of this it becomes possible to cause precipitates to form at targeted times. In particular, through the sizing and position of the moderation tube and of the at least one source for the partner component, it is possible in a corresponding heat treatment to establish whether or to what extent the formation of precipitates is to take place before or after the formation of the $Nb_3Sn$ phase. By way of this balance between grain refinement (by precipitates/oxidation before the formation of $Nb_3Sn$) and local precipitates (primarily through precipitates/oxidation after the formation of $Nb_3Sn$ phase) it is possible to adjust the distance between pinning centers in the conductor to the specific application of the conductor. Where precipitation/oxidation takes place before the formation of $Nb_3Sn$ phase, a finer $Nb_3Sn$ microstructure is developed. Where it takes place afterward, precipitates are formed within the existing $Nb_3Sn$ microstructure. By adjusting these processes it is possible to obtain a particularly high critical current density of the $Nb_3Sn$ phase in a large magnetic field range.

Whereas the prior art for its monofilaments for powder-in-tube precursor wires envisions siting the powder mixture of the power core directly in the reaction tube, it is better, according to the insights of the inventors, to utilize a moderation tube which comprises the powder core, in order to allow more effective control over the diffusion behavior of Sn and also, where appropriate, of the partner component Pk from the powder core into the reaction tube. There is no need for direct contact between the powder core and the reaction tube, and, indeed, such contact is disadvantageous, according to the realizations of the inventors, for the purpose of obtaining an improved current-carrying capacity on the part of the completed $Nb_3Sn$ superconductor wire. According to the realizations of the inventors, there is no prohibitive blockade of any partner component, especially oxygen, from the powder core, at any rate not if the monofilament is suitably dimensioned.

The alloy component X is typically a metal, and the partner component Pk is typically oxygen, and the precipitates XPk consist typically of a metal oxide; it is, however, also possible to obtain nonoxidic precipitates with different partner components, and to obtain a superconductor wire without oxidic precipitates, especially after the reaction annealing.

In the context of the invention it is possible to provide one kind or else two or more kinds of alloy components X in the reaction tube and to provide one kind or else two or more kinds of partner components Pk in the source or sources, with which one or else two or more kinds of precipitates XPk can be formed. In simple embodiments, only one kind of alloy component X and one kind of partner component Pk are used, resulting in one kind of precipitate XPk. If two or more kinds of partner components Pk are used, they may be provided in a common source, or else distributed over different sources, more particularly such that each source provides only one kind of partner component Pk. The abbreviation XPk represents any desired stoichiometric ratios of X and Pk in the precipitate.

A source is configured by one or more source structures which are disposed in a unitary radial position (corresponding to a radius interval within which all the source structures extend equally). A source may be annular or ringlike in configuration (not including the center of the monofilament, in other words be inwardly and outwardly radially bounded), or else may be centrally configured (including the center of the monofilament, thus being only outwardly radially bounded). Where the source consists of only one source structure, it is typically fully circumferential (over 360°) in configuration. Where the source consists of a plurality of source structures, these structures are typically disposed annularly and/or in uniform distribution in the circumferential direction. Different sources have a different radial position (with nonoverlapping radius intervals). Typical sources are configured by a powder (or a powder fraction) in the powder core (which in that case is simultaneously a source structure), or by a powder (or a powder fraction) in a ringlike circumferential powder layer (as a source structure) in the monofilament, or by a powder (or a powder fraction) of a filling of annularly disposed source tubules (as a plurality of source structures), or by a powder (or a powder fraction) of a filling of annularly disposed source pockets (as a plurality of source structures) on or in a different structure of the monofilament, or by a circumferential coating (as source structure) on a different structure of the monofilament.

The configuration of the moderation tube is typically continuous with a unitary microstructure and preferably with a unitary wall thickness; alternatively it may be configured of a plurality of nested sub-tubes with different compositions. The wall thickness WM of the moderation tube is usually relatively small in relation to the diameter DP of the powder core, usually with $WM \leq 0.2*DP$.

The chemical composition of the moderation tube is typically different from that of the reaction tube. If the moderation tube directly borders the reaction tube, the moderation tube typically contains no niobium or significantly less niobium than the reaction tube, e.g., 10.0 wt % Nb or less, or else 1.0 wt % Nb or less. If the moderation tube does not border the reaction tube, the moderation tube may easily also comprise more Nb or consist of Nb. The moderation tube, however, usually comprises Cu, at 50 wt % or more, for example.

Besides Nb and the at least one further alloy component X, the reaction tube may also comprise other alloy components, which do not form precipitates but are beneficial to the formation and/or the current-carrying capacity of the $Nb_3Sn$ phase, such as tantalum or titanium, for example. The reaction tube is continuous in configuration and fundamentally has a unitary microstructure, preferably with a uniform wall thickness.

The powder core may comprise Ag, Cu, Sn, C, $MoS_2$, stearates and/or α-BN, especially in order to improve the processing properties during production and/or forming of the monofilament, such as on drawing, for instance. Cu may serve, moreover, as a catalyst for the formation of the $Nb_3Sn$ phase. The elements and compounds present in the powder core serve, furthermore, to adjust the delivery of Sn and optionally the delivery of Pk during the heat treatment.

The monofilament typically comprises a shell tube (also referred to as matrix), which is usually fabricated of Cu or a Cu alloy, and which externally surrounds the monofilament. Usually there is also a diffusion barrier configured on the inside of the shell tube, in order to prevent diffusion of Sn or Pk into the Cu and hence not to reduce the residual resistance ratio (RRR) and the thermal conductivity of the matrix.

Typically a multiplicity of monofilaments are bundled and shaped, optionally also in a number of stages, in order to obtain a precursor wire. The precursor wire is wound into the desired form (a coil, for instance) and subjected to the reaction annealing, where the $Nb_3Sn$ phase and hence the superconductor wire is produced. The heat treatment is typically selected such that the precipitates which form supply an extremely high current density in the specific application. In this context it is important in particular whether the reaction of X with Pk takes place locally before and/or after the formation of $Nb_3Sn$ phase.

PREFERRED EMBODIMENTS

General Embodiments of the Monofilament

In one preferred embodiment of the monofilament of the invention, the monofilament comprises at least two sources Q, disposed at different radial positions, for the at least one partner component Pk. The spatially (more particularly radially) different disposition of the sources means that the time required during the reaction annealing for diffusion of the partner component Pk from the respective source to the reaction tube can be set differently, by way, for instance, of the length of the respective diffusion path and/or the rate of the diffusion, more particularly by way of putative interposed structures of the monofilament. Through the spatial separation of the sources, it is therefore possible to achieve, during the heat treatment, a difference in the arrival time of the respective partner component Pk (usually the same for both sources) from the at least two sources in the reaction tube, in particular in order to provide and, respectively, cause to react to form precipitates XPk, one part of the amount of substance of partner component Pk provided in the monofilament before the formation of the $Nb_3Sn$, and one part after the formation of the $Nb_3Sn$, in the region of the reaction tube. As a result it is possible in a targeted way both to bring about or establish a grain refinement of the $Nb_3Sn$, and, in a targeted way, to form pinning centers in the existing $Nb_3Sn$. As a result it is possible to achieve particularly high current carrying capacities of an eventual superconductor wire.

Also preferred is an embodiment in which the moderation tube is fabricated wholly or partly of Cu or a Cu alloy or Ag or an Ag alloy or Sn or an Sn alloy or Nb or an Nb alloy. With these materials it is possible to achieve good forming behavior on the part of the monofilament, especially for further reductions in cross section and bundling steps. It is noted that the moderation tube may also consist of a plurality of nested sub-tubes, fabricated of different materials, more particularly of the metals or alloys specified above.

Also advantageous is an embodiment in which the at least one source Q for the at least one partner component Pk comprises a powder. Preferably all of the sources are based on powders. In forming operations, powders allow a movement of the powder particles relative to adjacent structures and other powder particles, hence allowing materials defects in the monofilament and/or precursor wire to be minimized, particularly if the powder particles (metal oxide powders, for example) are themselves not plastically deformable.

Embodiments with Source in the Powder Core

Preferred is an embodiment in which the at least one source Q for the at least one partner component Pk comprises a powder present in the powder core. The installation of a source for the at least one partner component in the powder core is particularly simple to achieve; a corresponding Pk-containing powder may be admixed to the powder which serves as Sn source. Moreover, the diffusion behavior of partner component Pk from this source may also be influenced by way of the moderation tube.

In one advantageous development of this embodiment, the source Q which comprises a powder present in the powder core comprises oxygen as partner component Pk, and the moderation tube is fabricated of Cu or a Cu alloy. Surprisingly it has emerged that sufficient diffusion of oxygen from the powder core out through the Cu-containing moderation tube can be obtained in order to form, promptly and in sufficient number, precipitates in the reaction tube, for good current carrying capacity and/or grain refinement. By way of the thickness (wall thickness) of the moderation tube it is possible in particular to establish the diffusion path of the Sn and of the partner component Pk, with the diffusion rate of Sn and Pk in the moderation tube being fundamentally different (assisted optionally by additions in the powder core) and hence allowing the timing and site of the precipitate of XPk to be adjusted.

Particularly preferred is a development in which the wall thickness WM of the moderation tube is selected with
WM≤0.075*DP and/or WM≤0.2*WR
where DP is the diameter of the powder core and WR is the wall thickness of the reaction tube. At these wall thicknesses of the moderation tube, diffusion of the partner component Pk through the moderation tube has emerged as being sufficiently good, including the case wherein the partner component Pk in the powder core is oxygen; in particular, there has not been any formation, either, of a hindering niobium oxide barrier layer for O. If the wall thickness fluctuates over the circumference, the greatest wall thickness occurring can be assumed in each case as the wall thickness for the formulae above. Moreover, a Pk/X amount-of-substance ratio of 0.5-30 has proven generally advantageous for the monofilament; also generally advantageous is a fraction of 1-30 atom % of Pk in the powder core. The wall thickness of the moderation tube may be selected such that the production of the precipitates and hence the in-field properties of the conductor are boosted and also, optionally, adapted to the specific application. With preference also WM≥0.02*DP and/or WM≥0.05*WR.

Preferred, furthermore, is a development in which the powder core comprises Cu, Ag and/or Sn, more particularly elemental Cu, Ag and/or Sn. As a result of this it is possible to improve the processing properties of the monofilament and, optionally, to adjust the diffusion properties of the partner component Pk in the powder core, particularly if the partner component is oxygen.

Embodiments with an Annular Source

In one preferred embodiment, the at least one source Q for the at least one partner component Pk comprises an annular source, where the moderation tube is disposed radially within the annular source. With an annular source outside the moderation tube, it is possible to introduce a partner component Pk into the monofilament without the partner component Pk having to pass through the moderation tube. The nature and wall thickness of the moderation tube can then be established solely in accordance with the desired diffusion behavior of the Sn from the powder core. This makes it easier to control the diffusion processes. If the partner component Pk is disposed outside the powder core, it is possible, in particular with a moderation tube that has comparatively thick walls and/or has only little permeability for Sn, to achieve substantial temporal decoupling of the formation of Nb—Sn phase from the powder core from the formation of precipitate (oxidation, for instance), in order to form a larger amount of precipitates before the formation of $Nb_3Sn$ phase commences. In particular, Pk can be incorporated into the reaction tube (for instance, a delivery of oxygen), optionally, directly on the reaction tube. The introduction of Pk can be adjusted, according to the amount of Pk used, by means of additives such as Cu powders, for example. The annular form enables substantially uniform entry of the partner component via the circumference into the monofilament. It is noted that the monofilament may also comprise a plurality of annular sources for the at least one partner component Pk, the moderation tube being disposed in each of these sources. In particular it is possible to provide one annular source outside the reaction tube and one annular source inside the reaction tube, or else two annular sources outside the reaction tube. An annular source may consist of one source structure (as a circumferential coating or circumferential powder layer, for instance), or else may be formed from a plurality of discrete source structures disposed on a ring (for instance, powder fillings in source pockets or source tubules).

Preference is given to a development of this embodiment in which the annular source comprises a powder in a circumferential powder layer. With a powder it is possible to obtain good forming behavior, even if the powder comprises particles that are nonmetallic and/or particles that are not plastically deformable. The powder layer is comparatively easy to introduce, as for instance to fill into a gap between two tubular structures.

In an alternative development, the annular source comprises a powder in a powder filling of annularly disposed source tubules or source pockets, where the source pockets are configured in a monofilament structure adjacent to the annular source. By means of the source tubules (which may have a round or other cross section), the handling of the powder for the source during the production of the monofilament can be simplified. In particular it is possible to obtain a uniform and high powder density within the source tubule, in general comparatively simply. The source tubules may in particular be fabricated from copper or Nb or an X-containing Nb alloy (more particularly the X-containing Nb alloy of the reaction tube). The source tubules are typically placed into a gap between two other structures of the monofilament, as for instance between the moderation tube and the reaction tube, or between the reaction tube and an ancillary reaction tube. Source pockets may be configured as radial recesses on the inside or outside of the adjacent structure, or else as cavities in the adjacent structure; in the source pockets it is usually easier to obtain a uniform powder density than in a circumferential powder layer. In the case of a source comprising two or more annularly disposed source structures, (radially) continuous structure regions may remain, in the circumferential direction between the source structures, with these regions providing greater ease of processing in comparison to a circumferential source (one which is segmented or continuous in peripheral direction).

It is preferred if the powder layer or the powder filling comprises a metallic powder, especially where the metallic powder comprises elemental Cu or a Cu alloy or Ag or an Ag alloy. By means of the metallic powder it is possible to improve the processing properties and also, optionally, to improve the delivery and/or uptake of Pk and/or adjust such delivery/uptake for the specific application. Particularly suitable for adjusting diffusion properties of the partner component are Cu, Ag or Sn.

In a further development, the annular source comprises a circumferential coating of a monofilament structure adjacent to the annular source, especially where the adjacent structure is the reaction tube or the moderation tube. A coating is comparatively simple to apply, for instance on a structure before it is inserted into the monofilament. A coating may be accomplished by means of spray coating, for example.

Embodiments with an Outer Annular Source

Preferred, furthermore, is a development in which the reaction tube is disposed radially within the annular source, especially where the annular source externally directly surrounds the reaction tube. Diffusion of the partner component into the reaction tube can take place, from the annular source outside the reaction tube, independently of the diffusion of the Sn from the powder core into the reaction tube. As a result it is possible for the two diffusion processes to be easily harmonized with one another. Where the annular source surrounds the reaction tube directly, the introduction of partner component Pk into the reaction tube can take place with particular rapidity, for effective grain refinement, for instance, for precipitates before the formation of the $Nb_3Sn$ phase. Alternatively to direct surrounding, it is also possible to envision an auxiliary moderation tube disposed between the reaction tube and the annular source; as a result, the introduction of the partner component can be temporally controlled more effectively, and in particular delayed, during the reaction annealing.

With preference in this case, the monofilament comprises an ancillary reaction tube, where the ancillary reaction tube comprises Nb,
especially where the ancillary reaction tube further comprises the at least one further alloy component X as well, and wherein the annular source is disposed radially within the ancillary reaction tube, especially where the ancillary reaction tube externally directly surrounds the annular source. If the annular source is disposed between reaction tube and ancillary reaction tube, the partner component may be transmitted radially outwardly and inwardly, for particularly rapid penetration of these two tubes.

Embodiments with an Inner Annular Source

Also advantageous is a development in which the annular source is disposed radially outside the moderation tube and radially within the reaction tube. With this disposition, partner component and Sn reach the reaction tube from the same side, and consequently it is possible in general to achieve balanced concentration ratios of Sn and Pk and also of Nb and X at the reaction front of $Nb_3Sn$ formation. In particular it is not necessary for the partner component to cross the reaction tube completely by means of diffusion, as would be the case with an external annular source. Consequently it is possible to achieve particularly high current carrying capacities. If only the diffusion of Sn takes place through the moderation tube, the material of said tube can be selected more flexibly. This allows the use of materials with particularly low Sn permeability. As a result, Sn diffusion can be decoupled more strongly from Pk diffusion than in the case of mixed powder cores.

Advantageously in this case the monofilament further comprises an ancillary moderation tube, and the annular source is disposed radially within the ancillary moderation tube, and the ancillary moderation tube is disposed radially within the reaction tube,
especially where the ancillary moderation tube externally directly surrounds the annular source. With the ancillary moderation tube it is possible to control the diffusion from the annular source into the reaction tube. Typical materials for the ancillary moderation tube correspond to the materials for the moderation tube.

Embodiments Relating to the Chemical Systems

In one preferred embodiment the at least one source comprises a chemical compound comprising a partner component Pk of the at least one partner component Pk, where the chemical compound on exposure to heat breaks down at a first temperature T1 into this partner component Pk and a first residual compound, where the first residual compound also still comprises this partner component Pk, but with a lower stoichiometric fraction than the chemical compound, and on further exposure to heat, at a second temperature T2, with T2>T1, the first residual compound breaks down into this partner component Pk and a second residual compound. As a result it is possible, when employing a suitable temperature program (for instance with a first temperature plateau at or somewhat above T1 and a second temperature plateau at or somewhat above T2, or else with a slow temperature rise to T1 and additionally to T2 or somewhat above it), to release the partner component Pk at different times during the reaction annealing and thereby, in a targeted way, to provide one part of the partner component before the formation of $Nb_3Sn$, and one part after or during the formation of $Nb_3Sn$. An example of a chemical compound which releases oxygen in two stages is potassium permanganate. Alternatively, the source may also comprise a chemical compound which breaks down into the partner component Pk and a residual compound which no longer contains any partner component Pk.

In another advantageous embodiment the at least one source Q comprises at least two different partner components Pk, which on reaction annealing are able to form different kinds of precipitates XPk with the at least one further alloy component X,
especially where the reaction tube also comprises at least two different further alloy components X, and the different partner components Pk each form the different precipitates XPk with another of the various further alloy components X in each case. In general the two different partner components are released at different times during the heat treatment in the reaction annealing, and/or the different partner components have different diffusion rates. As a result it is possible to form precipitates in a targeted way both before and after the formation of the $Nb_3Sn$ phase, in order to improve the current carrying capacity through grain refinement and formation of pinning centers.

Also advantageous is an embodiment in which the at least one source Q comprises a first chemical compound and a second chemical compound, each comprising the same partner component Pk, where on heat treatment the first chemical compound releases the partner component Pk at a lower temperature than the second chemical compound. The first chemical compound releases Pk at the temperature T1, and the second chemical compound releases Pk at T2, with T1<T2. As a result it is possible in turn, when employing a suitable temperature program (for instance, with a first temperature plateau at or somewhat above T1 and a second temperature plateau at or somewhat above T2, or else with a slow temperature rise from T1 to T2 or somewhat above it), to release the partner component Pk at different times during the reaction annealing and hence, in a targeted way, to provide one part of the partner component before the formation of $Nb_3Sn$, and one part after or during the formation of $Nb_3Sn$.

Particularly preferred is an embodiment in which the at least one partner component Pk comprises oxygen, and the at least one alloy component X comprises a metal which is less noble than Nb. This system of materials can be installed with particular simplicity and at favorable cost.

In one development of this embodiment, the source Q for the at least one partner component Pk comprises a powder comprising a metal oxide, especially where the metal oxide is $SnO$, $SnO_2$, $CuO$, $Cu_2O$, $AgO$, $Ag_2O$, $Ag_2O_3$, $Na_2O_2$, $CaO_2$, $ZnO_2$, $MgO_2$, $NbO_2$ or $Nb_2O_5$. These systems of materials exhibit effective improvement in the superconducting current carrying capacity, and are simple to use and of favorable cost. The metal of the alloy component X is selected to be less noble than the metal of the metal oxide of the partner component Pk. As a result of the powder form, the metal oxide in the monofilament is easier to form.

Also preferred is a development in which at least one alloy component X comprises one or more of the elements Mg, Al, V, Zr, Ti, Gd or Hf. These alloy components are simple to work with, and form effective precipitates for improving the current carrying capacity of the superconductor wire.

In one advantageous embodiment the precipitates XPk comprise nonoxidic precipitates, more particularly are exclusively nonoxidic precipitates. For the formation of nonoxidic precipitates XPk, the partner component is selected not as oxygen; if exclusively nonoxidic precipitates are to be formed, none of the partner components can be oxygen. Oxygen possesses a high affinity to a multiplicity of substances, and especially to the metals customarily built into monofilament, such as Nb, Sn, and Cu. This may lead to the formation of oxide layers at unwanted sites, which block desired diffusion processes. These problems can very largely be avoided by using nonoxidic precipitates and, accordingly, omitting oxygen as a partner component. The reaction partners of nonoxidic precipitates can be harmonized with one another in a targeted way, so that during the heat treatment they react essentially only with one another, but not with other metals customarily built in the monofilament, which therefore allows unwanted secondary reactions, which block desired diffusion processes, to be minimized or excluded. It is also possible, for a monofilament having two partner components Pk and/or two different types of precipitates XPk, to envision one oxidic precipitate and one nonoxidic precipitate.

In another advantageous embodiment the precipitates comprise nonmetallic precipitates, more particularly are exclusively nonmetallic precipitates. Nonmetallic precipitates form distinct phase boundaries to surrounding intermetallic $Nb_3Sn$ matrix, which is usually favorable for flux pinning and allows particularly high current carrying capacities.

In one preferred development of this embodiment the at least one partner component Pk comprises sulfur, and the at least one alloy component X comprises zinc. Sulfur may be introduced in elemental form, for example, into a powder, or else as a sulfide of a metal nobler than zinc, in the form of copper sulfide, for instance, and is comparatively reactive. Zinc sulfide can form precipitates comparatively easily. Instead of zinc it is also possible to use other base metals, especially alkali metals or alkaline earth metals, as an alloy component.

Also preferred is an embodiment in which the at least one partner component Pk comprises silicon, carbon or a halogen. With these partner components as well it is possible to form precipitates as an alternative to oxygen as a partner component. As alloy component X for these partner components it is possible to select, for example Ca (for partner component Si, Si being present preferably in elemental form in the source, for $Ca_2Si$ precipitates) or Fe (for partner component C, C being present preferably in graphitic form in the source, for $Fe_3C$-precipitates), or Mg, Al, V, Zr, Ti, Ta, Gd or Hf (for halogen partner components, the halogen being present preferably as halide in the source, more particularly as AgF or $SnF_2$, or copper trifluoroacetate, for the formation of halidic precipitates).

Methods of the Invention for Producing a Superconductor Wire

Also within the ambit of the present invention is a method for producing a superconductor wire,
where a plurality of monofilaments of the invention, as described above, is subjected to single-stage or multistage bundling and reshaping, to give a precursor wire,
and where the precursor wire is brought into a desired shape, more particularly by winding, and is subjected to a reaction annealing, where precipitates XPk are formed from the at least one alloy component X and the at least one partner component Pk, and $Nb_3Sn$ is formed from the Nb of the reaction tubes and the Sn of the powder cores. With this method it is possible to obtain a superconductor wire having particularly high current carrying capacity. The forming may be implemented, for example, as a drawing operation. The reaction annealing takes place typically at a temperature between 400° C. and 800° C.

Further advantages of the invention are evident from the description and the drawing. Likewise, the features identified above and those set out hereinafter may be used, in accordance with the invention, each individually on their own or as two or more thereof in any desired combinations. The embodiments shown and described should be understood not as a conclusive recitation, but instead have more of an exemplary nature for the depiction of the invention.

BRIEF DESCRIPTION OF THE DRAWINGS

The invention is shown schematically in the drawing and is explained in more detail through exemplary working examples.

DETAILED DESCRIPTION

Figure 1:
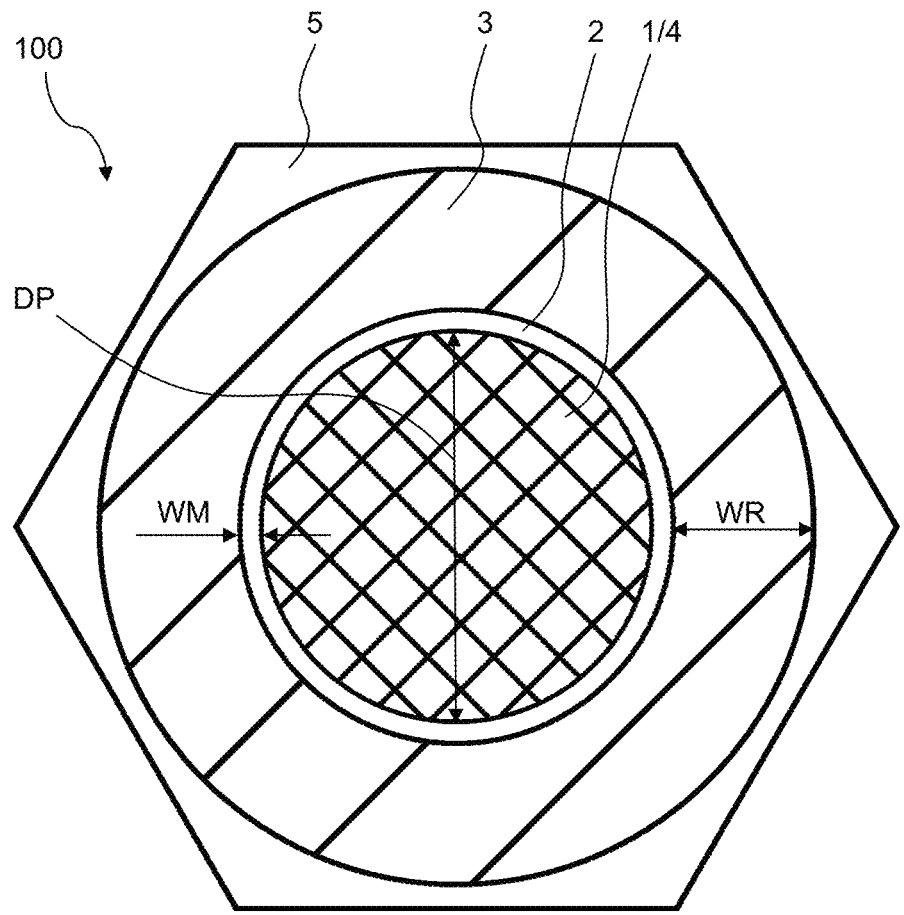
FIG. 1 shows an embodiment of a monofilament of the invention, with a source for the at least one partner component integrated into the powder core.

FIGS. 1 to 9 show embodiments of monofilaments 100 of the invention in a schematic cross section (that is, perpendicularly to the longitudinal direction of the monofilaments 100), which can be used in the context of the invention to fabricate an $Nb_3Sn$-containing superconductor wire using the powder-in-tube approach.

All embodiments comprise a central powder core 1, in which there is an Sn-containing powder or powder mixture, and also a moderation tube 2, in which the powder core 1 is disposed, and a reaction tube 3, which is fabricated from an alloy which comprises Nb (usually in a very large fraction, preferably at not less than 50 wt % or not less than 80 wt %) and further comprises at least one alloy component X (usually with a small fraction, such as with 0.3-3.0 wt %, for example). Reaction annealing is accompanied by formation of the $Nb_3Sn$ phase from the Sn of the powder core 1 and from the Nb of the reaction tube 3. Outwardly, the monofilament 100 is bounded in each case by a matrix 5 (also called shell tube), which is usually fabricated of Cu or a Cu alloy, and which in the embodiments shown has a hexagonal outer contour in each case, in order to facilitate bundling; alternatively, the matrix 5 may also be configured with a round outer cross section.

In each embodiment, furthermore, the monofilament 100 comprises at least one source 4 for at least one partner component Pk. The reaction annealing is accompanied by the formation, from the partner component Pk and the alloy component X, of precipitates XPk which (according to the time at which they are formed) lead to grain refinement of the developing $Nb_3Sn$ phase or to the formation of local precipitates in the existing $Nb_3Sn$ phase, which act as pinning centers, and thereby improve the superconducting current carrying capacity of the completed superconductor wire.

The different embodiments of monofilaments 100 differ primarily in the configuration of the one or the two or more sources 4, particularly their number, geometric disposition, and composition.

In the case of the embodiment of FIG. 1, the powder core 1 serves simultaneously as the (sole) source 4 for the partner component Pk (indicated by double hatching of the powder core 1). The powder core 1 is formed here by a mixture of Sn powder and $NbSn_2$ powder (as Sn source for the formation of $Nb_3Sn$), and also Cu powder (as catalyst for the formation of $Nb_3Sn$) and $SnO_2$ powder (as a source for the partner component Pk, which here is oxygen).

The moderation tube 2, here made of Cu, possesses a comparatively low wall thickness WM in comparison to the wall thickness WR of the reaction tube 3 and to the diameter DP of the powder core 1, here approximately with WM=0.15*WR and WM=0.055*DP. As a result it is possible to obtain sufficient diffusion of the oxygen through the moderation tube 2. It is noted that in this case the moderation tube 2 controls both the diffusion of the Sn and the diffusion of the partner component Pk; to balance out the diffusion of Sn and Pk, the powder core 1 may comprise suitable further additions, such as of Ag powder.

The reaction tube 3 here is an NbZr1 alloy, in other words with zirconium as the alloy component X with a fraction of 1 wt %. If desired, the alloy of the reaction tube 3 may also comprise Ta or other alloy additions which are conducive to the formation of the $Nb_3Sn$ phase and/or to the superconducting properties thereof. The reaction annealing is accompanied here by the formation of $ZrO_2$ precipitates in the $Nb_3Sn$ material.

In the powder core 1 and/or in the source 4, besides $SnO_2$, it is also possible, optionally, for a further oxygen-containing compound to be provided, $Gd_2O_3$ for example. As a result, during the heat treatment, oxygen is released twice at different times.

Alternatively, rather than $SnO_2$, the oxygen source 4 stockpiled in the powder core 1 may also be a Pk-containing chemical compound that breaks down in two stages, for instance a permanganate compound such as $KMnO_4$. The permanganate may first release a part of its oxygen, with $MnO_2$ forming as a first reaction product (first residual compound), among others. This $MnO_2$ may then give off further oxygen on further supply of heat, forming elemental Mn as a second reaction product (second residual compound). This as well enables a temporally staggered, twofold release of oxygen.

Through a temporally staggered, twofold release of the partner component Pk it is possible to make precipitates form both before $Nb_3Sn$ formation (for grain refinement of the $Nb_3Sn$ phase) and thereafter (for additional artificial pinning centers).

Figure 2:
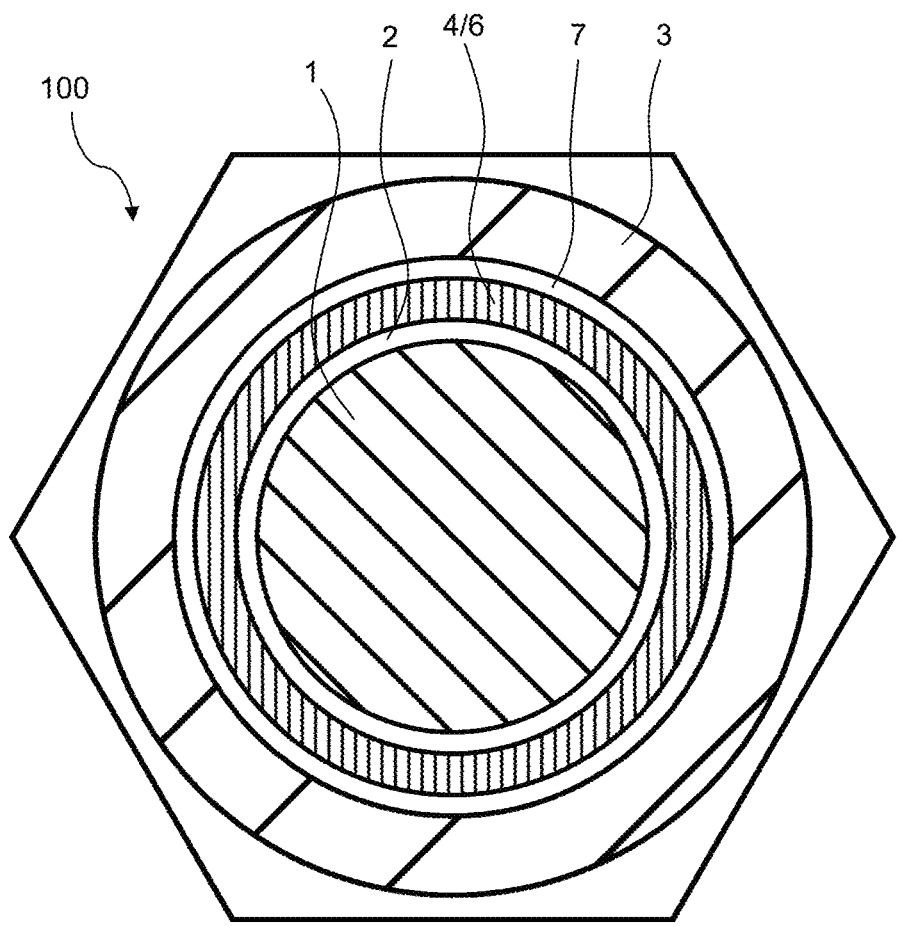
FIG. 2 shows an embodiment of a monofilament of the invention, with an annular source around the moderation tube and with an ancillary moderation tube around the annular source.

In the embodiment of the monofilament 100 that is shown in FIG. 2, the powder core 1 serves only as a Sn source, but not as a source for a partner component (consequently the powder is shown with only single hatching). The powder core 1 is enclosed by the moderation tube 2, which here controls the diffusion only of Sn, but not of partner component Pk. The moderation tube 2 is here enclosed in turn by the annular (sole) source 4 for partner component Pk, which here is configured as a completely circumferential powder layer 6 comprising $SnO_2$ powder (for the provision of partner component Pk, namely oxygen) and metallic Cu powder (for improving the deformation properties). Here, disposed between the powder layer 6 and the reaction tube 3, there is also an ancillary moderation tube 7, which jointly controls the diffusion of the partner component Pk and of the Sn into the reaction tube 3.

Figure 3:
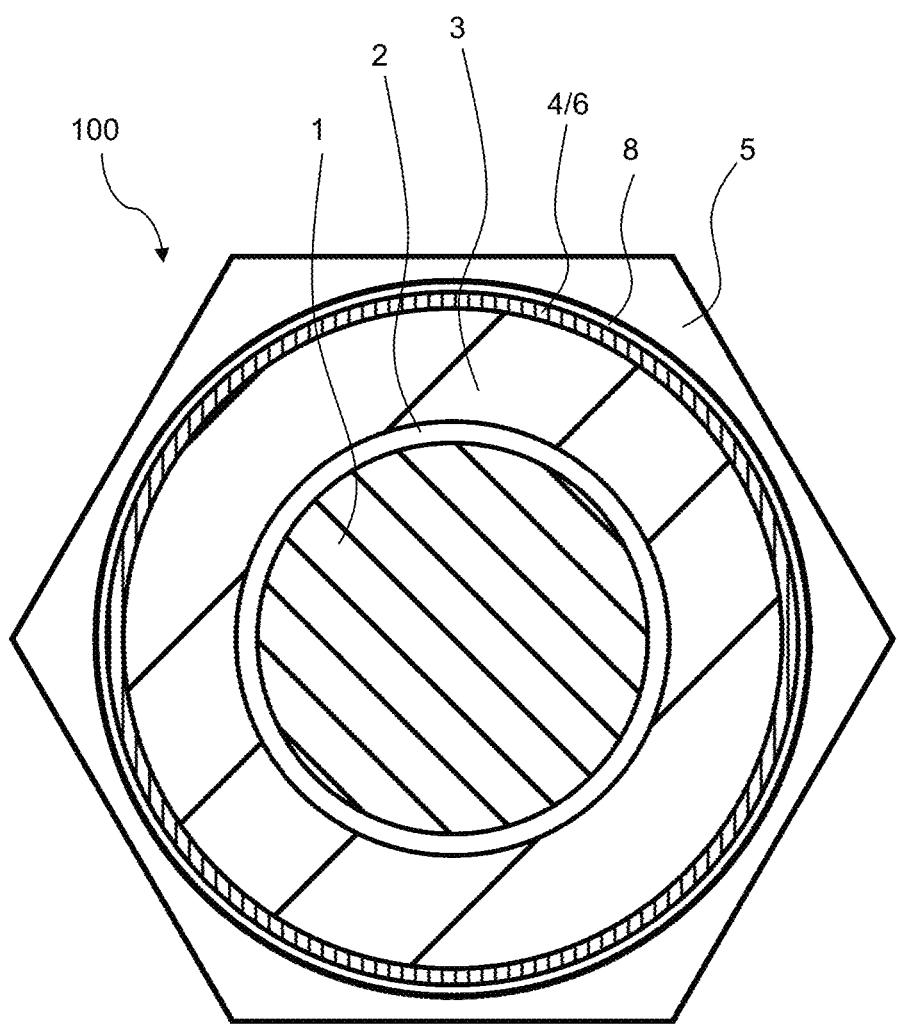
FIG. 3 shows an embodiment of a monofilament of the invention with an annular source around the reaction tube and with a diffusion barrier around the annular source.

In the case of the FIG. 3 embodiment of the monofilament 100, the annular (sole) source 4 for partner component Pk is configured in turn as a powder layer 6, but is disposed radially outside the reaction tube 3, with the powder layer 6 here directly enclosing the reaction tube 3. As a result, the partner component Pk has very rapid access to the reaction tube 3. In order to diffuse into the reaction tube 3 which comprises the alloy component X, the Sn from the powder core 1 has to cross the moderation tube 2. As a result, the diffusion of the Sn into the reaction tube 3 can be delayed, to allow precipitates of XPk to form in the reaction tube before the $Nb_3Sn$ phase is formed.

In this embodiment, shown by way of example, there is also a diffusion barrier 8, made of Ta, for instance, on the inside of the matrix 5, and this barrier 8 makes it possible to prevent contamination of the matrix 5 by diffusion of elements from the interior (especially of Sn) and hence to prevent a reduction in the residual resistance ratio (RRR) of the matrix 5.

Figure 4:
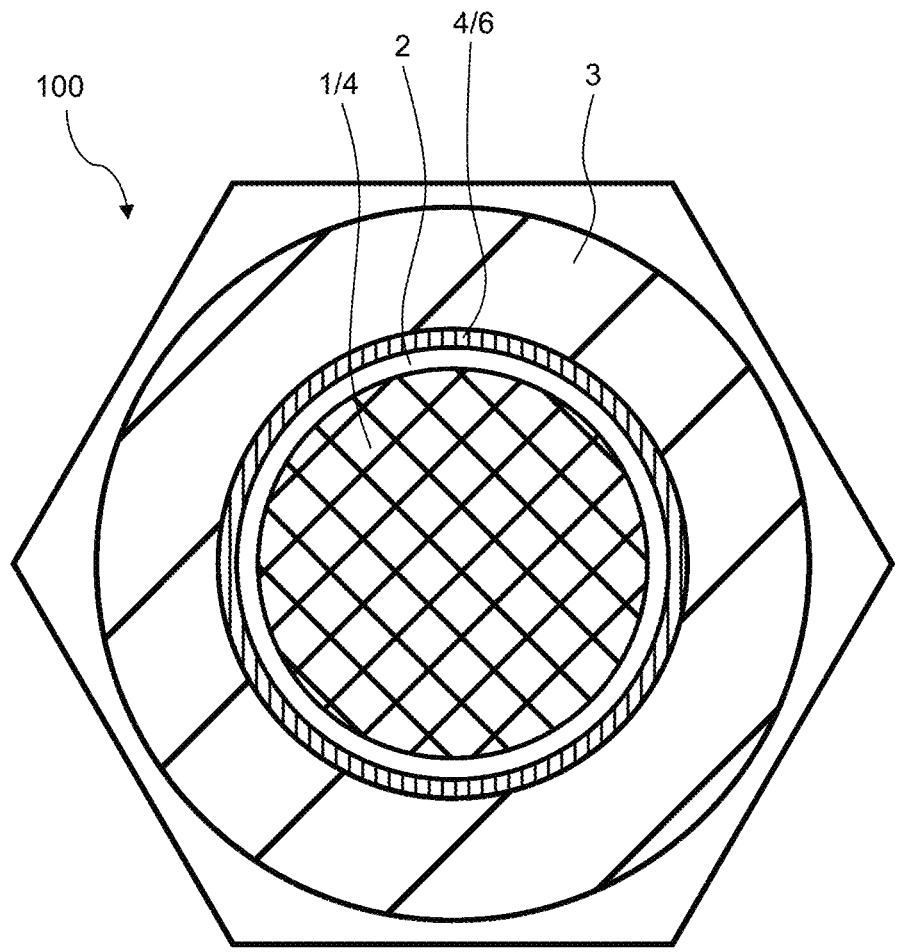
FIG. 4 shows an embodiment of a monofilament of the invention with a first source integrated into the powder core and with an annular second source around the moderation tube.

In the FIG. 4 embodiment of a monofilament 100 of the invention there are two sources 4 for partner component Pk.

On the one hand, the powder core 1 here serves simultaneously as a source 4 for a partner component Pk, with the powder core comprising a corresponding Pk-containing chemical compound—here, $SnO_2$ powder for oxygen as partner component Pk. On the other hand, a further source 4 for a partner component Pk is here disposed around the moderation tube 2, and within the reaction tube 3 which comprises the alloy component X. This further source 4 is configured with a circumferential powder layer 6, which here likewise has $SnO_2$ powder for oxygen as partner component Pk.

The partner component Pk from the powder layer 6 reaches the reaction tube 3, during the reaction annealing, before the partner component Pk from the powder core 1. As a result it is possible to introduce the partner component Pk both before $Nb_3Sn$ formation and after $Nb_3Sn$ formation into the reaction tube 3 (or into the structurers arising therefrom).

In the embodiment shown, the chemical compounds in both sources 4 are the same, providing the same partner component Pk. Alternatively, it is also possible to provide different chemical compounds in the various sources 4, for providing the partner component Pk, or else for providing different partner components Pk (in order to form precipitates XPk which in that case are also different). In particular, provision may be made for the formation both of oxidic precipitates and of nonoxidic precipitates in the course of a reaction annealing.

Figure 5:
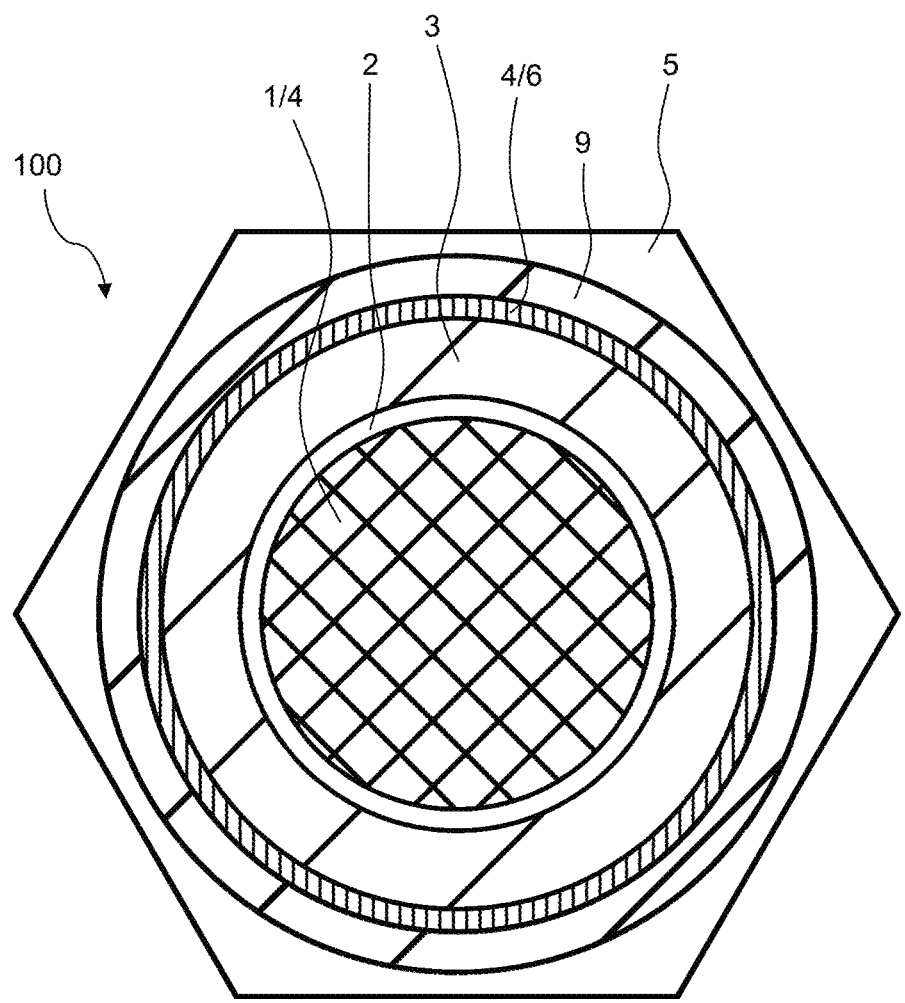
FIG. 5 shows an embodiment of a monofilament of the invention with a first source integrated into the powder core and with an annular second source around the reaction tube.

In the embodiment of FIG. 5 there are likewise two sources 4 for the monofilament 100 therein.

One source 4 is again formed by the powder core 1, which here is admixed with $SnO_2$ powder. Also provided is an annular source 4 which in this case is configured as a powder layer 6 comprising $SnO_2$ powder and which here directly encloses the reaction tube 3. The powder layer 6 is in turn enclosed, radially on the outside, by an ancillary reaction tube 9, which in this case has the same composition as the reaction tube 3, and in particular likewise comprises Nb and the alloy component X.

With this construction, partner component Pk is able very rapidly to pass from the powder layer 6 both into the reaction tube 3 and into the ancillary reaction tube 9, in order to form precipitates XPk, in particular before the formation of the $Nb_3Sn$ phase, in order to bring about a fine microstructure for this phase. The partner component Pk from the powder core 1 arrives in large parts after the Sn from the powder core 1 in the reaction tube 3 and in the ancillary reaction tube 9, to then form punctiform precipitates as artificial pinning centers. The time of the inward diffusion of the Sn and of Pk from the powder core 1 can be adjusted suitably via the moderation tube 2, particularly the wall thickness thereof, with optional support from additions in the powder core 1.

Figure 6:
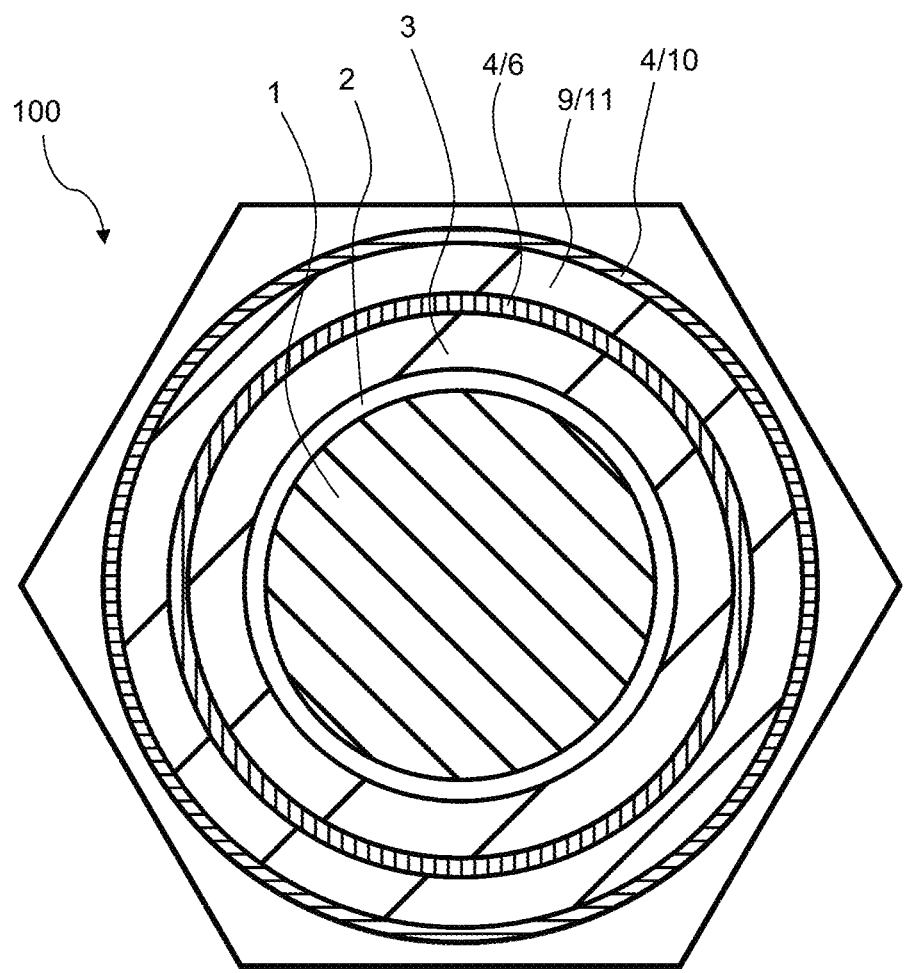
FIG. 6 shows an embodiment of a monofilament of the invention with an annular first source, which is disposed around the reaction tube, and with an annular second source, which is disposed around an ancillary reaction tube that surrounds the first annular source.

The FIG. 6 embodiment of the monofilament 100 likewise envisions two sources 4, which here are configured both as annular sources 4.

One of the sources 4 is again configured as a powder layer 6 comprising $SnO_2$ powder, and sits directly radially externally on the reaction tube 3, so that partner component Pk can penetrate rapidly from the powder layer 6 into the reaction tube 3 and form precipitates XPk with alloy component X present therein, in this case zirconium, especially before the $Nb_3Sn$ phase comes about. The other source 4 for partner component Pk is configured here as a coating 10 on the outside of the ancillary reaction tube 9. The ancillary reaction tube 9 in turn sits externally directly on the powder layer 6. Partner component Pk from the coating 10 reaches the reaction tube 3 later than the partner component Pk of the powder layer 6.

By appropriately adjusting the wall thickness of the ancillary reaction tube 9 and the wall thickness of the moderation tube 2, it is possible to make Sn from the powder core 1 reach the reaction tube 3 before the partner component Pk from the coating 10 reaches the reaction tube 3.

The ancillary reaction tube 9 here has the same composition as the reaction tube 3, hence also comprising niobium and zirconium, and so the volume of the ancillary reaction tube 9 as well can be utilized for the formation of an $Nb_3Sn$ phase. If desired, instead of the ancillary reaction tube 9, it is also possible to employ a tube made of a material (Cu, for instance) with which there is no notable contribution to the generation of $Nb_3Sn$ phase volumes (for instance, because little or no niobium is present, or because the tube is simply of relatively thin configuration), but with which a desired hindering of the diffusion of the partner component Pk from the coating 10 radially inward to the reaction tube 3 is achieved. In this case this tube is termed an auxiliary moderation tube 11.

Materials particularly suitable for the coating 10 are those which are plastically deformable or exhibit low friction during deformation, since these materials do not produce any defects on further processing (for instance, in the event of a forming operation which reduces the cross section). The coating for example may consist of graphitic carbon as partner component Pk, which together with Fe (iron) as alloy component X in the reaction tube 3 is able to produce an iron carbide precipitate. In the powder layer 6 it is also possible to utilize materials which are not plastically deformable, as for instance oxidic powder particles of $SnO_2$, since the powder form imparts a certain flowability. Oxygen from the oxidic powder particles may form, with Zr as alloy component X, for example, $ZrO_2$ precipitates in the reaction tube; in this example, then, the reaction tube 3 (besides Nb) also comprises Fe and Zr as two alloy components X.

Figure 7:
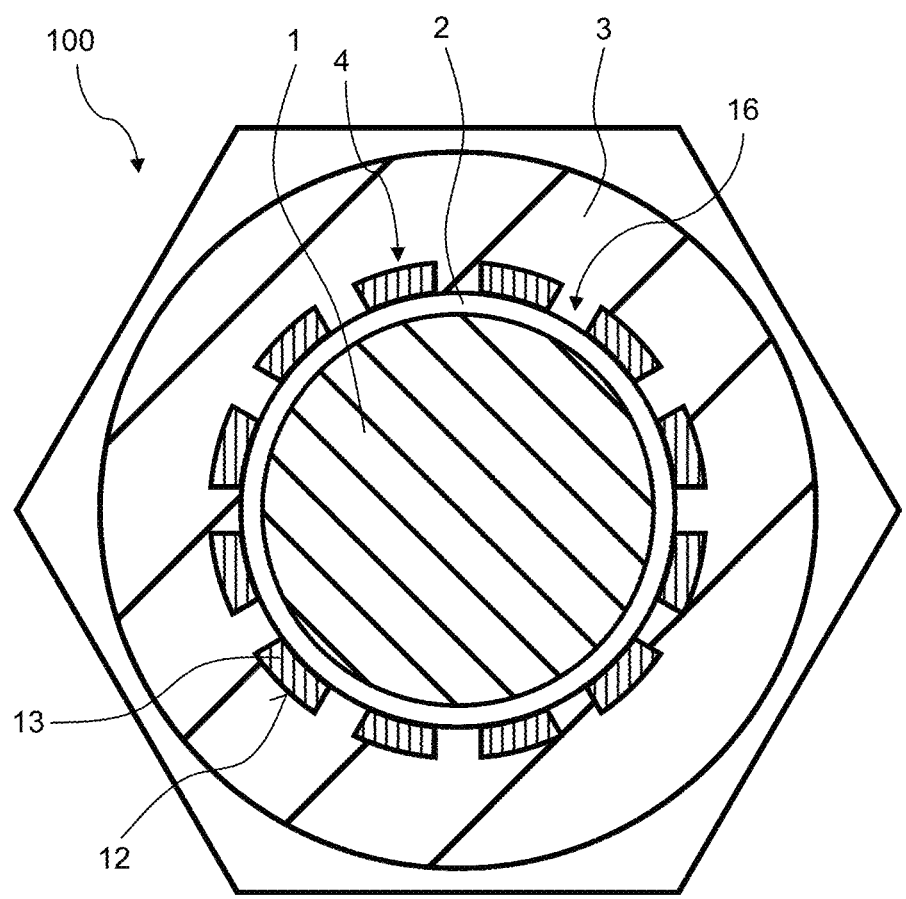
FIG. 7 shows an embodiment of a monofilament of the invention with an annular source which is configured with recess-like source pockets on the inside of the reaction tube.

FIG. 7 shows an embodiment of a monofilament 100 in which source pockets 12 are configured on the radial inside of the reaction tube 3. The source pockets 12 here are recesses on the reaction tube 3 that have a powder filling 13. The powder filling 13 comprises a powder which comprises the (at least one) partner component Pk, in this case $SnO_2$ powder for the oxygen partner component, and here, furthermore, a metallic powder, Cu powder for instance, to improve the formability. The source pockets 12 are all disposed at a unitary (identical) radial position in the monofilament 100, and constitute a plurality of source structures which in their entirety form an annular source 4 for the partner component Pk in the monofilament 100. Remaining between the source pockets 12 in the circumferential direction are radially continuous structural regions 16, here configured by the reaction tube 3 and in contact with the moderation tube 2, which improve the processing properties of the monofilament 100.

Figure 8:
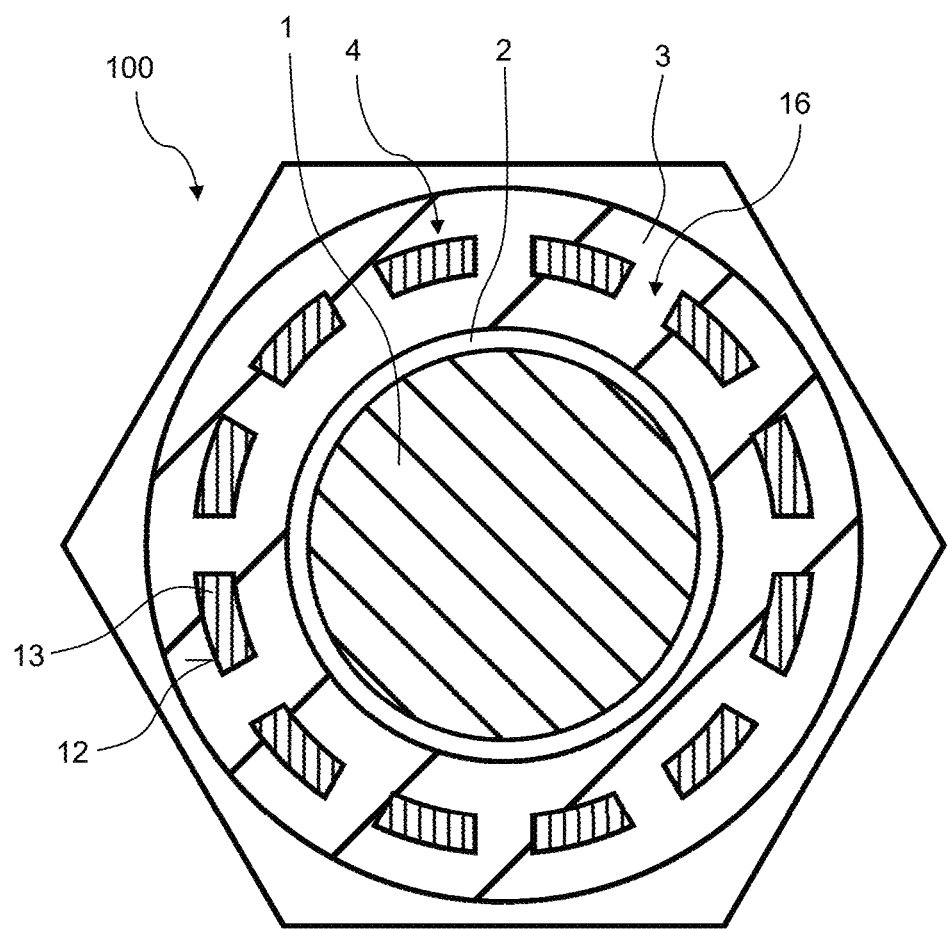
FIG. 8 shows an embodiment of a monofilament of the invention with an annular source which is configured with closed source pockets in the interior of the reaction tube.

The FIG. 8 embodiment of a monofilament 100 likewise shows an annular source 4 formed of a plurality of source pockets 12 which are disposed at a unitary radial position in the monofilament 100 and which again have a powder filling 13 which here comprises $SnO_2$ powder. In the embodiment shown, the source pockets 12 are configured as recesses, closed on all sides, within the reaction tube 3. Again there remain radially continuous structural regions 16 between the source pockets 12 in the reaction tube 3.

Figure 9:
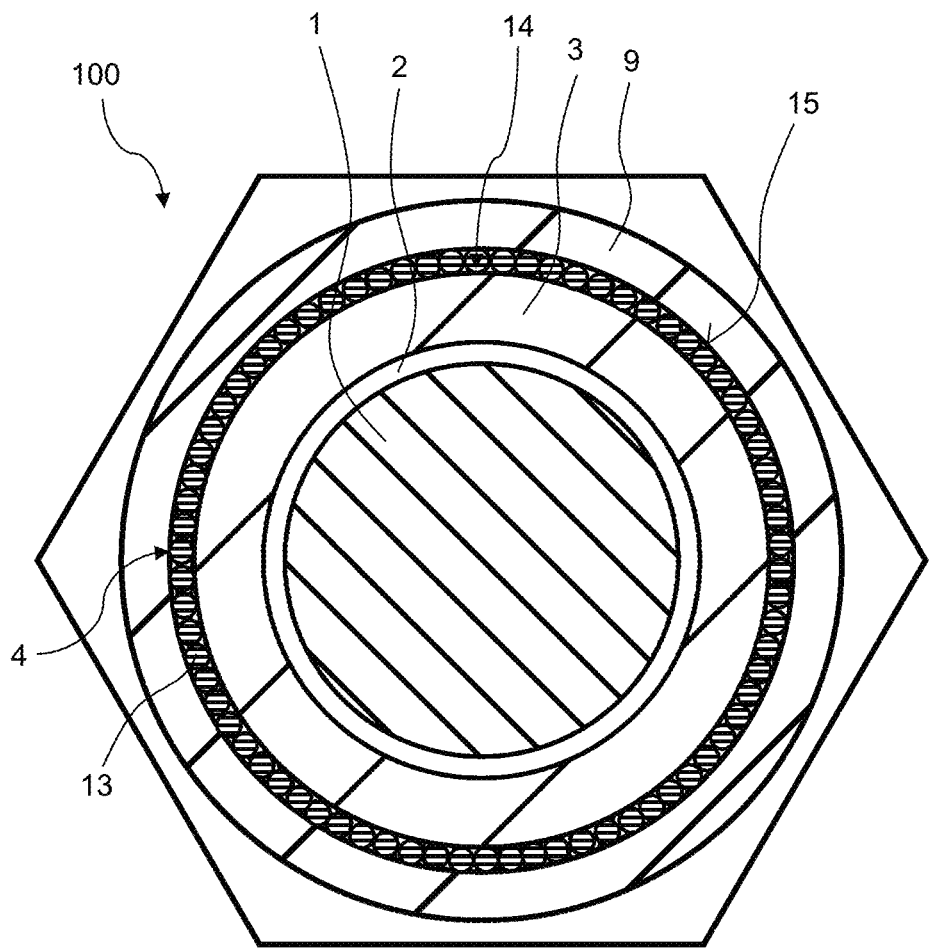
FIG. 9 shows an embodiment of a monofilament of the invention with an annular source which is configured with source tubules which are disposed between the reaction tube and an ancillary reaction tube.

In the embodiment of a monofilament 100 that is shown in FIG. 9, there is an annular source 4 which is formed of a multiplicity of source tubules 14 as source structures, which are installed in a radial gap 15 between the internally bordering reaction tube 3 and the externally bordering ancillary reaction tube 9. The source tubules 14 are formed here with a round cross section and have a powder filling 13 which comprises a powder comprising the at least one partner component Pk. It is noted that after a customary forming operation which reduces cross section, the voids between the source tubules 14 in the gap 15 are filled up (not shown) with material from the bordering reaction tube 3 and from the bordering annularly reaction tube 9.

Figure 10:
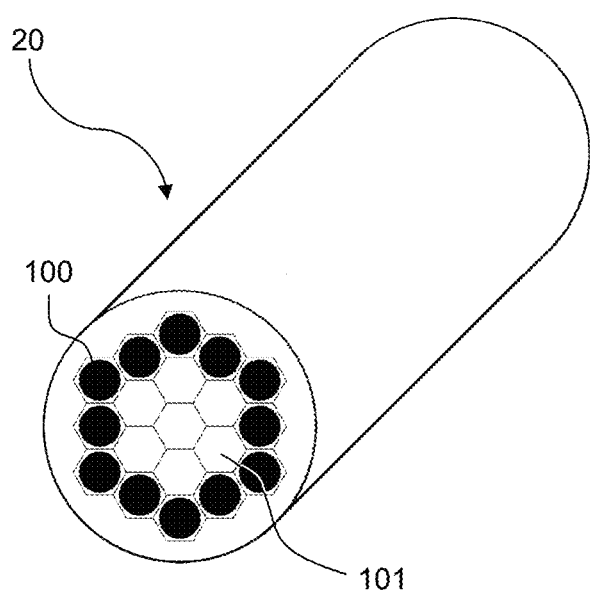
FIG. 10 shows a precursor for an $Nb_3Sn$ superconductor wire, in which a plurality of monofilaments of the invention are bundled.

FIG. 10 shows a precursor 20 for an $Nb_3Sn$-containing superconductor wire for the invention. The precursor 20 comprises a plurality of monofilaments 100 of the invention ("bundling"), the monofilaments 100 here being disposed annularly. The precursor 20 here, moreover, is fabricated of copper.

Disposed typically in the precursor 20 are a plurality of monofilaments 100 with a hexagonal outer cross section and optionally (as shown here) a plurality of stabilizing elements 101 with the same hexagonal outer cross section, usually composed of Cu or a Cu alloy, which are placed lying against one another in hexagonal close packing in an outer tube.

Following introduction of the monofilaments 100, the precursor 20 is subjected to a forming operation which reduces cross section (optionally a multiple bundling and cross-sectionally reducing forming operation is also employed), to give a precursor wire which is subsequently wound into a desired form, such as the form of a coil, for instance.

Figure 11:
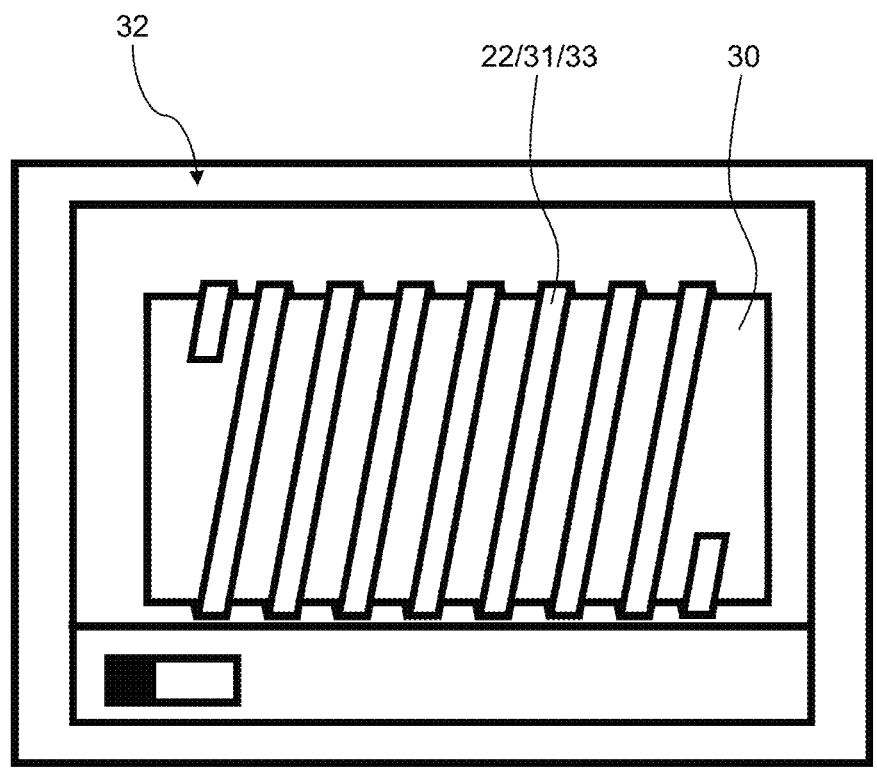
FIG. 11 shows an oven arrangement for implementing a reaction annealing in accordance with the invention.

FIG. 11 shows the precursor wire 20, wound into a coil 31 on a spool 30, arranged in an oven 32.

In the oven 32, the precursor wire 20 is subjected to reaction annealing, typically at a temperature between 400° C. and 800° C.; this reaction annealing may last several days. During this procedure, superconducting $Nb_3Sn$ forms from the Sn of the powder core and from the Nb of the reaction tubes, and precipitates XPk form from the at least one partner component Pk of the at least one source and from the at least one alloy component X of the reaction tube.

After the reaction annealing, an $Nb_3Sn$-containing superconductor wire 33 has formed from the precursor wire 22, and the $Nb_3Sn$ phase of this wire 33 also comprises the precipitates XPk. The superconductor wire 33 exhibits a particularly high superconducting current carrying capacity.

Figure 12:
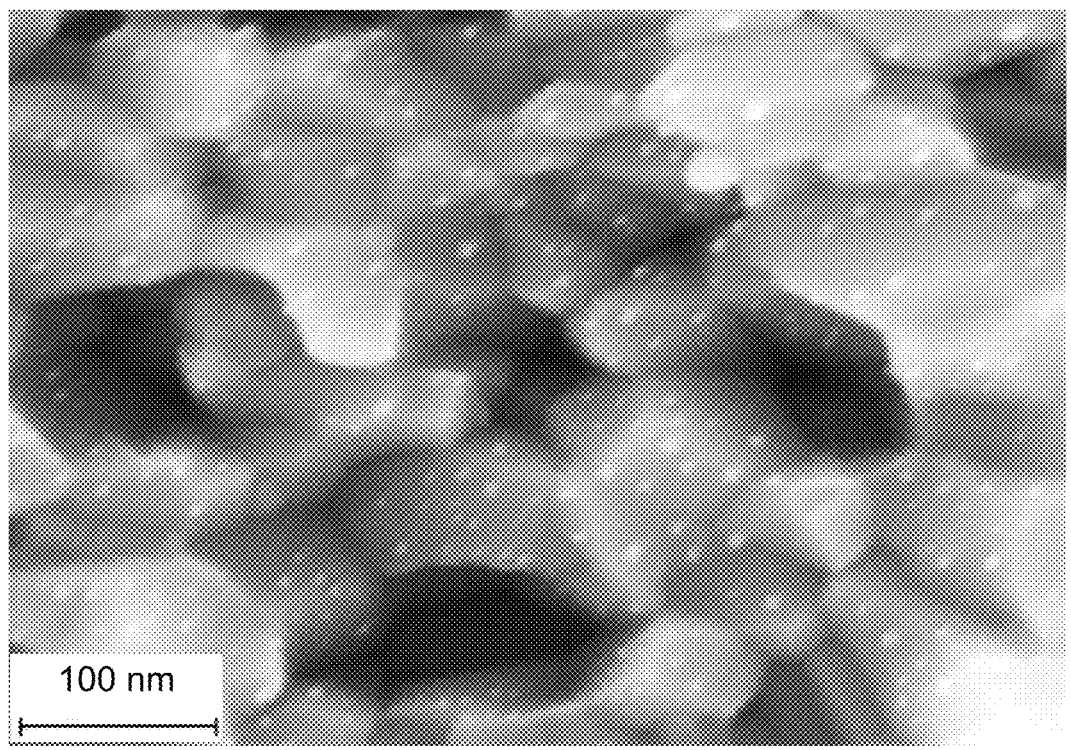
FIG. 12 shows an SEM micrograph of the $Nb_3Sn$ phase of a superconductor wire fabricated in accordance with the invention, with visible precipitates on a fracture face.

FIG. 12 shows an SEM micrograph of the $Nb_3Sn$ phase of a superconductor wire fabricated in accordance with the invention. The associated monofilament contained $SnO_2$ powder as oxygen source in the powder core, the powder core having been enclosed in a copper moderation tube. The surrounding reaction tube consisted of an NbZr1 alloy. The reaction annealing involved a treatment time of 300 h in a multistage temperature program with a maximum temperature of 640° C. The wire diameter was 1 mm, and the diameter of a monofilament in the superconductor wire was 40 μm. Clearly apparent are $ZrO_2$ precipitates (light-colored dots) on the $Nb_3Sn$ grains, which may act as artificial pinning centers. The $Nb_3Sn$ grains typically have diameters of around 30-80 nm. In a control experiment in which the powder core contained no $SnO_2$, no precipitates and a relatively coarse microstructure (not shown) were observed.

In summary, the invention relates to a monofilament for a powder-in-tube precursor wire for an $Nb_3Sn$-containing superconductor wire, with an Sn-containing powder core disposed radially within an Nb-containing reaction tube, where the monofilament is set up for the formation of precipitates XPk in the region of the $Nb_3Sn$ phase during the reaction annealing. The monofilament comprises at least one source for at least one partner component Pk, and the reaction tube is admixed with at least one alloy component X, allowing the precipitates XPk to be formed in the region of the reaction tube during the reaction annealing. The powder core is in a moderation tube, in order for the delivery of the Sn to the reaction tube and hence the formation of $Nb_3Sn$ to be controlled (in particular, delayed) and, overall, to be temporally harmonized, together with the construction of the monofilament, with the formation of the precipitates, more particularly so that precipitates are formed at least before and preferably also after formation of the $Nb_3Sn$ phase. The configuration of the monofilament (and the implementation of the reaction annealing) is preferably such that during the reaction annealing, partner component Pk reaches the reaction tube in at least two temporally successive waves—more particularly, where one wave reaches the reaction tube primarily before the formation of the $Nb_3Sn$ phase, and one wave reaches the reaction tube primarily after the formation of the $Nb_3Sn$ phase. For this purpose, the monofilament may in particular have at least two separate sources for partner component Pk at different radial positions, or may have at least two different chemical compounds in the at least one source, each delivering partner component Pk at different temperatures, or may have, in the at least one source, a chemical compound which delivers partner component Pk in two stages at different temperatures, in other words by way of an intermediate stage.

LIST OF REFERENCE SYMBOLS 1 powder core
2 moderation tube
3 reaction tube
4 source
5 matrix
6 powder layer
7 ancillary moderation tube
8 diffusion barrier
9 ancillary reaction tube
10 coating
11 auxiliary moderation tube
12 source pockets
13 powder filling
14 source tubules
15 gap
16 radially continuous structural region
20 precursor
22 precursor wire
30 spool
31 coil
32 oven
33 superconductor wire
100 monofilament
101 stabilizing element
DP diameter of powder core
WM wall thickness of moderation tube
WR wall thickness of reaction tube

What is claimed is:

1. A monofilament for producing an $Nb_3Sn$-containing superconductor wire,
comprising:
a powder core comprising an Sn-containing powder,
a reaction tube composed of an Nb alloy comprising Nb and at least one further alloy component X,
wherein the powder core is disposed within the reaction tube,
at least one source for at least one partner component Pk,
wherein each source is disposed in a unitary radial position in the monofilament and comprises at least one source structure,
wherein the alloy component X and the partner component Pk are selected to form precipitates XPk through reaction annealing of the monofilament, in which Sn from the powder core and Nb from the reaction tube react to produce $Nb_3Sn$, and
a moderation tube disposed within the reaction tube, wherein the powder core is disposed within the moderation tube, and
wherein the reaction tube and the moderation tube have mutually differing chemical compositions.

2. The monofilament as claimed in claim 1, comprising at least two source structures, for the at least one partner component Pk, wherein the source structures are disposed at differing positions within the monofilament.

3. The monofilament as claimed in claim 1, wherein the moderation tube is fabricated at least partly from a material selected from the group: Cu, a Cu alloy, Ag, an Ag alloy, Sn, an Sn alloy, Nb, or an Nb alloy.

4. The monofilament as claimed in claim 1, wherein the at least one source for the at least one partner component Pk comprises a powder.

5. The monofilament as claimed in claim 1, wherein the at least one source for the at least one partner component Pk comprises a powder present in the powder core.

6. The monofilament as claimed in claim 5, wherein the source which comprises a powder present in the powder core comprises oxygen as the partner component Pk, and wherein the moderation tube is fabricated of Cu or a Cu alloy.

7. The monofilament as claimed in claim 5, wherein a wall thickness WM of the moderation tube is defined by:

WM≤0.075*DP and/or WM≤0.2*WR
where DP is the diameter of the powder core and WR is the wall thickness of the reaction tube.

8. The monofilament as claimed in claim 5, wherein the powder core comprises at least one of the following elements: Cu, Ag and Sn.

9. The monofilament as claimed in claim 1, wherein the at least one source for the at least one partner component Pk comprises an annular source, and wherein the moderation tube is disposed coaxially within the annular source.

10. The monofilament as claimed in claim 9, wherein the annular source comprises a powder in a circumferential powder layer.

11. The monofilament as claimed in claim 9, wherein the annular source comprises a powder in a powder filling of annularly disposed source tubules or source pockets.

12. The monofilament as claimed in claim 9, wherein the annular source comprises a metallic powder.

13. The monofilament as claimed in claim 9, wherein the annular source is adjacent to the reaction tube or to the moderation tube, and comprises a circumferential coating on the reaction tube or on the moderation tube.

14. The monofilament as claimed in claim 9, wherein the reaction tube is disposed coaxially within the annular source.

15. The monofilament as claimed in claim 14, further comprising:
an ancillary reaction tube which comprises Nb, wherein the annular source is disposed coaxially within the ancillary reaction tube.

16. The monofilament as claimed in claim 9, wherein the annular source is disposed coaxially around the moderation tube and coaxially within the reaction tube.

17. The monofilament as claimed in claim 16, wherein the monofilament further comprises an ancillary moderation tube,
wherein the annular source is disposed coaxially within the ancillary moderation tube, and
wherein the ancillary moderation tube is disposed coaxially within the reaction tube.

18. The monofilament as claimed in claim 1, wherein the at least one source comprises a chemical compound comprising a partner component Pk of the at least one partner component Pk,
wherein the at least one source comprises a chemical compound comprising a partner component Pk, wherein, on heat treatment at a first temperature T1, the chemical compound releases the partner component Pk at a first fraction and, on heat treatment at a second temperature T2>T1, the chemical component releases the partner component Pk at a second fraction.

19. The monofilament as claimed in claim 1, wherein the at least one source comprises at least two differing partner components Pk, which on reaction annealing form differing precipitates XPk with the at least one further alloy component X.

20. The monofilament as claimed in claim 1, wherein the at least one source comprises a first chemical compound and a second chemical compound, which each comprise a mutually same partner component Pk, and wherein, on heat treatment, the first chemical compound releases the partner component Pk at a lower temperature than does the second chemical compound.

21. The monofilament as claimed in claim 1, wherein the at least one partner component Pk comprises oxygen, and the at least one alloy component X comprises a metal which is less noble than Nb.

22. The monofilament as claimed in claim 21, wherein the source for the at least one partner component Pk comprises a powder comprising a metal oxide.

23. The monofilament as claimed in claim 21, wherein the at least one alloy component X comprises at least one of the elements selected from the group consisting of Mg, Al, V, Zr, Ti, Gd or Hf.

24. A monofilament for producing an $Nb_3Sn$-containing superconductor wire,
comprising:
a powder core comprising an Sn-containing powder,
a reaction tube composed of an Nb alloy comprising Nb and at least one further alloy component X,
wherein the powder core is disposed radially within the reaction tube,
at least one source for at least one partner component Pk,
wherein each source is disposed in a unitary radial position in the monofilament and comprises at least one source structure,
wherein the alloy component X and the partner component Pk are selected to form precipitates XPk through reaction annealing of the monofilament, in which Sn from the powder core and Nb from the reaction tube react to produce $Nb_3Sn$, and
wherein the precipitates XPk comprise nonoxidic precipitates, and
a moderation tube disposed within the reaction tube and in which the powder core is disposed.

25. The monofilament as claimed in claim 1, wherein the precipitates comprise nonmetallic precipitates.

26. A method for producing a superconductor wire, comprising:
subjecting a plurality of monofilaments as claimed in claim 1 to single-stage or multistage bundling and reshaping, to provide a precursor wire,
bringing the precursor wire into a desired shape, and
subjecting the shaped precursor wire to a reaction annealing, wherein precipitates XPk are formed from the at least one alloy component X and the at least one partner component Pk, and wherein $Nb_3Sn$ is formed from the Nb of the reaction tubes and the Sn of the powder cores.

27. A monofilament for producing an $Nb_3Sn$-containing superconductor wire,
comprising:
a powder core comprising an Sn-containing powder,
a reaction tube composed of an Nb alloy comprising Nb and at least one further alloy component X,
wherein the powder core is disposed radially within the reaction tube,
at least one source for at least one partner component Pk,
wherein each source is disposed in a unitary radial position in the monofilament and comprises at least one source structure,
wherein the alloy component X and the partner component Pk are selected to form precipitates XPk through reaction annealing of the monofilament, in which Sn from the powder core and Nb from the reaction tube react to produce $Nb_3Sn$,
wherein the precipitates XPk comprise nonoxidic and nonmetallic precipitates, and
wherein the at least one partner component Pk comprises sulfur, and the at least one alloy component X comprises zinc, and a moderation tube disposed within the reaction tube and in which the powder core is disposed.

28. A monofilament for producing an $Nb_3Sn$-containing superconductor wire,
comprising:
a powder core comprising an Sn-containing powder,
a reaction tube composed of an Nb alloy comprising Nb and at least one further alloy component X,
wherein the powder core is disposed radially within the reaction tube,
at least one source for at least one partner component Pk,
wherein each source is disposed in a unitary radial position in the monofilament and comprises at least one source structure,
wherein the alloy component X and the partner component Pk are selected to form precipitates XPk through reaction annealing of the monofilament, in which Sn from the powder core and Nb from the reaction tube react to produce $Nb_3Sn$,
wherein the precipitates XPk comprise nonoxidic and nonmetallic precipitates, and,
wherein the at least one partner component Pk comprises silicon, carbon or a halogen, and
a moderation tube disposed within the reaction tube and in which the powder core is disposed.

* * * * *